(12) United States Patent
Cheng

(10) Patent No.: US 9,459,940 B2
(45) Date of Patent: Oct. 4, 2016

(54) DATA TRANSMISSION METHOD FOR DATA TRANSMISSION SYSTEM

(71) Applicant: Action Star Enterprise Co., Ltd., New Taipei (TW)

(72) Inventor: Ching-Wei Cheng, New Taipei (TW)

(73) Assignee: ACTION STAR ENTERPRISE CO., LTD. (TW)

( * ) Notice: Subject to any disclaimer, the term of this patent is extended or adjusted under 35 U.S.C. 154(b) by 321 days.

(21) Appl. No.: 14/260,287

(22) Filed: Apr. 24, 2014

(65) Prior Publication Data

US 2015/0309850 A1    Oct. 29, 2015

(51) Int. Cl.
   *G06F 3/048*      (2013.01)
   *G06F 9/54*       (2006.01)
   *G06F 3/0484*     (2013.01)
   *G06F 17/50*      (2006.01)

(52) U.S. Cl.
   CPC ............. *G06F 9/543* (2013.01); *G06F 3/0484* (2013.01); *G06F 17/5009* (2013.01)

(58) Field of Classification Search
   None
   See application file for complete search history.

(56) References Cited

U.S. PATENT DOCUMENTS

| | | | | |
|---|---|---|---|---|
| 6,901,455 | B2 * | 5/2005 | Gough | G06F 9/543 370/392 |
| 8,296,728 | B1 * | 10/2012 | Webster | G06F 9/4443 717/105 |
| 2003/0182388 | A1 * | 9/2003 | Alexander | G06F 9/543 709/213 |
| 2008/0048975 | A1 * | 2/2008 | Leibow | G06F 3/023 345/156 |
| 2009/0319247 | A1 * | 12/2009 | Ratcliffe, III | G09B 19/0053 703/13 |
| 2009/0319909 | A1 * | 12/2009 | Hsueh | G06F 9/543 715/740 |
| 2011/0131179 | A1 * | 6/2011 | Ohata | G06F 9/468 707/609 |
| 2012/0066691 | A1 * | 3/2012 | Branton | G06F 9/543 719/312 |
| 2015/0160881 | A1 * | 6/2015 | Lewis | G06F 9/30 711/103 |
| 2015/0215570 | A1 * | 7/2015 | Leibow | G06F 3/1454 386/231 |

* cited by examiner

*Primary Examiner* — Hua Lu

(57) ABSTRACT

The present invention relates to a data transmission method applied to a data transmission system comprising a data transmission device, at least one host computer and at least one associated computer, wherein all the at least one host computer and the at least one associated computer are disposed with a plurality of switching system clipboards, and have one computer clipboard thereof. Therefore, by the disposing of the plurality of switching system clipboards, two or more users are allowed to simultaneously carry out their computer switching operations and data transmissions between multi computers through one identical data transmission system, moreover, the file size of the transmitted data does not be limited by the data transmission device of the data transmission system.

11 Claims, 11 Drawing Sheets

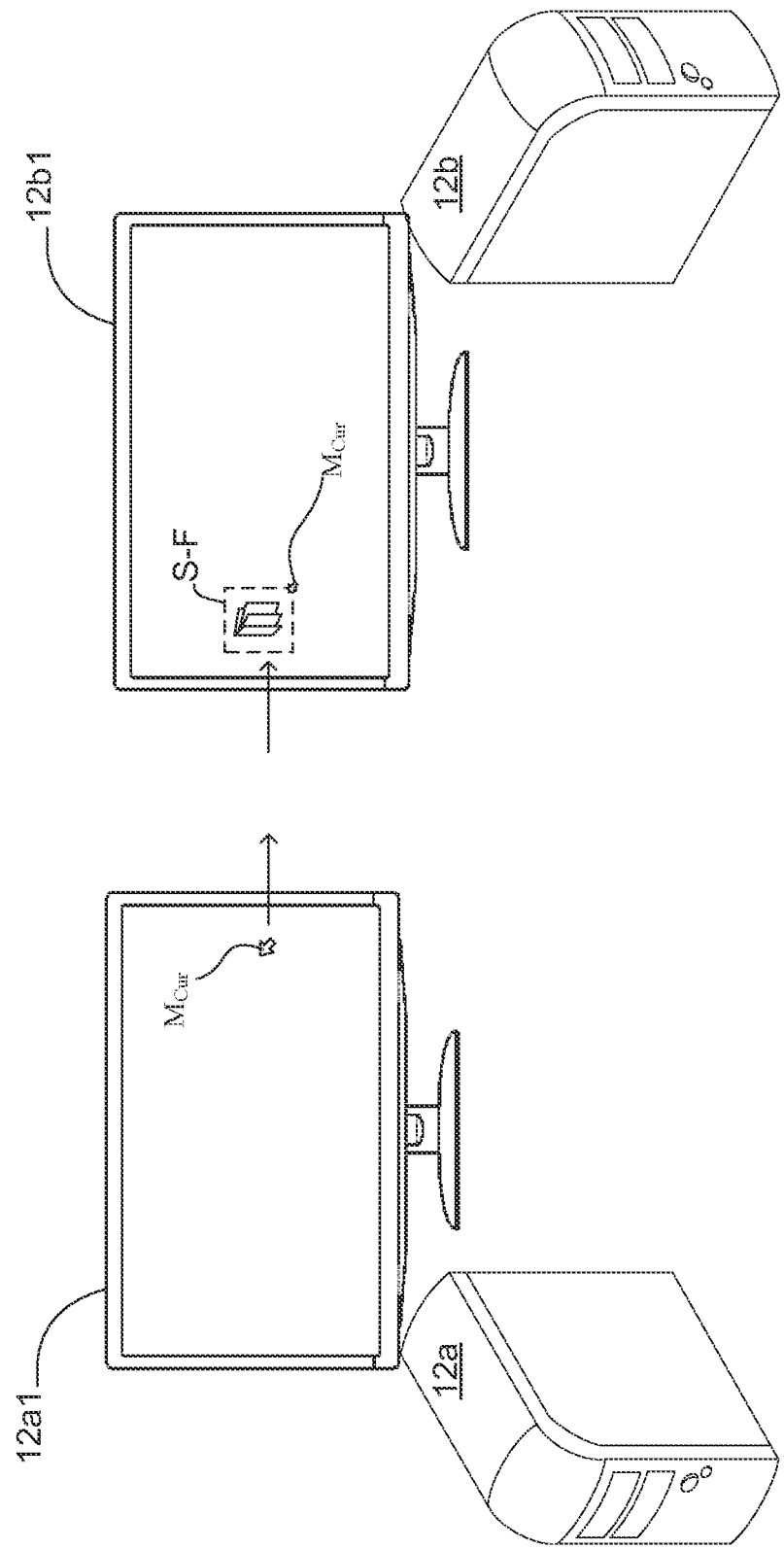

DATA TRANSMISSION METHOD FOR DATA TRANSMISSION SYSTEM

BACKGROUND OF THE INVENTION

1. Field of the Invention

The present invention relates to the technology field of data transmission, and more particularly to a data transmission method for data transmission system capable of utilizing clipboard function efficiently.

2. Description of the Prior Art

With the developments of sciences and technologies, KVM (keyboard/video/mouse) switching devices are widely applied in providing engineers to carry out the operation switches between multiple computers, so as to facilitate the engineers able to complete their works by using two or more computers. An American patent, having the patent number of U.S. Pat. No. 6,901,455, teaches a peripheral sharing device with unified clipboard memory", wherein the schematic data transmission diagram for the peripheral sharing device with unified clipboard memory is shown as FIG. 1.

In order to transmit data, step (S201') is firstly executed for treating a copy command or a cut company to a selected data by broadcasting way, and then the selected data is temporarily stored in the clipboard memory of the peripheral sharing device through step (S202'). Next, step (S203') is executed for changing the computer operated by the user via the peripheral sharing device. Therefore, in step (S204'), the data stored in the clipboard memory of the peripheral sharing device would be copied to the computer under operation and shown on the displayer of the computer after the user broadcasts a past command.

The data transmission way used in the peripheral sharing device with unified clipboard memory taught by U.S. Pat. No. 6,901,455 includes the advantages of simple structure and easy to be carried out; however, the data transmission way used in the peripheral sharing device still includes a primary drawback of: (1) the file size of the transmitted data is directly limited by the file capability of the clipboard memory of the peripheral sharing device; and (2) the data transmission way cannot provide two or more computers to complete data transmission by accessing the clipboard memory of the peripheral sharing device at the same time.

Accordingly, another American patent with patent publication number of US 2009/0319909 proposes a novel data transmission method shown as FIG. 2. To carry out data transmission, the novel data transmission method firstly proceeds to step (S410'), so as to facilitate a user 2' to make a copy/cut command through a KVM switching device 310' after a data in a first computer PC1' is selected. Next, in steps (S420') and (S430'), the selected data is transmitted to the KVM switching device 310' from the first computer PC1', and then further transmitted to a second computer PC2' and a N-th computer PCn' via the KVM switching device 310' by broadcasting. Therefore, after a user makes a paste command to the second computer PC2' (step (S440')) or the N-th computer PCn' (step (S460')), the data transmitted to the computer PC2' or the N-th computer PCn' can be shown on the displayer of the computer PC2' or the N-th computer PCn'.

Obviously, the data transmission method proposed by US 2009/0319909 can indeed solve the problem occurring in the transmission way taught by U.S. Pat. No. 6,901,455; however, in the data transmission method proposed by US 2009/0319909, the data selected by the user would be transmitted to the clipboards of others computers after one user operates one computer and makes a cut/copy command. Meanwhile, if another one user operates another one computer and makes a cut/copy command at the same time, the data temporarily stored in the clipboards of computers would be replaced by a new selected and transmitted data. Also, the data transmission method proposed by US 2009/0319909 cannot provide two or more computers to complete data transmission by accessing the clipboards of the computers at the same time.

Accordingly, in view of the conventional data transmission method for the data transmission between multiple computers still including drawbacks and shortcomings, the inventor of the present application has made great efforts to make inventive research thereon and eventually provided a data transmission method for data transmission system.

SUMMARY OF THE INVENTION

The primary objective of the present invention is to provide a data transmission method data transmission method applied to a data transmission system comprising a data transmission device, at least one host computer and at least one associated computer, wherein all the at least one host computer and the at least one associated computer are disposed with a plurality of switching system clipboards, and have one computer clipboard thereof. Therefore, by the disposing of the plurality of switching system clipboards, two or more users are allowed to simultaneously carry out their computer switching operations and data transmissions between multi computers through one identical data transmission device, moreover, the file size of the transmitted data does not be limited by the data transmission device of the data transmission system.

Accordingly, to achieve the primary objective of the present invention, the inventor of the present invention provides a data transmission method for data transmission system, comprising the steps of:

(1) providing a data transmission system having a data transmission device, at least one host computer and at least one associated computer, wherein all the at least one host computer and the at least one associated computer are installed with a switching application, and the switching application sets a plurality of switching system clipboards in each of the at least one host computer and the at least one associated computer;

(2) a first user operates any one un-operation computer of the at least one host computer and the at least one associated computer for making the un-operation computer become a first under-operation computer, so as to select a first data and then treat the first data with a first cut command or a first copy command;

(3) the first data is stored into the computer clipboard of the first under-operation computer, and simultaneously stored into a first switching system clipboard of the plurality of switching system clipboards in each of the at least one host computer and the at least one associated computer;

(4) the first user carries out a first computer switching operation through the data transmission device, so as to operate any one un-operation computer of the at least one host computer and the at least one associated computer for making the un-operation computer become a first under-operation computer; meanwhile, the first data stored in the first switching system clipboard is further stored into the computer clipboard of the first under-operation computer; and (5) the first user makes a first paste command by operating the first under-operation computer, so as to show the first data in the operation window of the first under-operation computer.

In addition, according to the preferable embodiment of the data transmission method of the present invention, the data transmission method for data transmission system further comprises the steps of:

(2a) a second user operates any one un-operation computer of the at least one host computer and the at least one associated computer for making the un-operation computer become a second under-operation computer, so as to select a second data and then treat the second data with a second cut command or a second copy command;

(3a) the second data is stored into the computer clipboard of the second under-operation computer, and simultaneously stored into a second switching system clipboard of the plurality of switching system clipboards in each of the at least one host computer and the at least one associated computer;

(4a) the second user carries out a second computer switching operation through the data transmission device, so as to operate any one un-operation computer of the at least one host computer and the at least one associated computer for making the un-operation computer become a second under-operation computer; meanwhile, the second data stored in the second switching system clipboard is further stored into the computer clipboard of the second under-operation computer; and (5a) the second user makes a second paste command by operating the second under-operation computer, so as to show the second data in the operation window of the second under-operation computer.

Moreover, according to the preferable embodiment of the data transmission method of the present invention, the data transmission method for data transmission system further comprises the steps of:

(2b) a N-th user operates any one un-operation computer of the at least one host computer and the at least one associated computer for making the un-operation computer become a third under-operation computer, so as to select a N-th data and then treat the N-th data with a N-th cut command or a second N-th command;

(3b) the N-th data is stored into the computer clipboard of the third under-operation computer, and simultaneously stored into a N-th switching system clipboard of the plurality of switching system clipboards in each of the at least one host computer and the at least one associated computer;

(4b) the N-th user carries out a third computer switching operation through the data transmission device, so as to operate any one un-operation computer of the at least one host computer and the at least one associated computer for making the un-operation computer become a third under-operation computer; meanwhile, the N-th data stored in the N-th switching system clipboard is further stored into the computer clipboard of the third under-operation computer; and (5b) the N-th user makes a N-th paste command by operating the third under-operation computer, so as to show the N-th data in the operation window of the third under-operation computer.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein:

FIGS. 5A, 5B and 5C are schematic operation diagrams of the data transmission method for data transmission system;

DETAILED DESCRIPTION OF THE PREFERRED EMBODIMENTS

To more clearly describe a data transmission method for data transmission system according to the present invention, embodiments of the present invention will be described in detail with reference to the attached drawings hereinafter.

Figure 1:
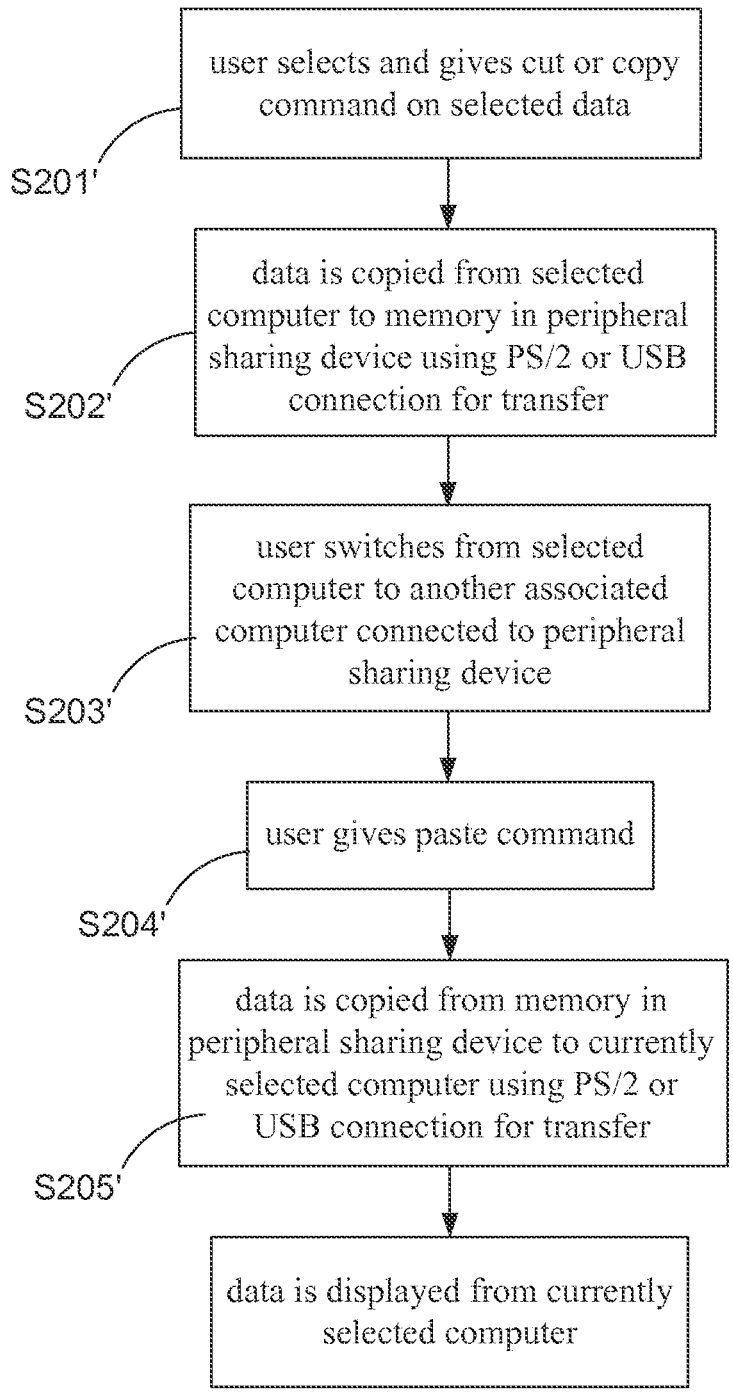
FIG. 1 is a schematic data transmission diagram for a peripheral sharing device with unified clipboard memory proposed by an American patent with the patent number of U.S. Pat. No. 6,901,455.
Figure 2:
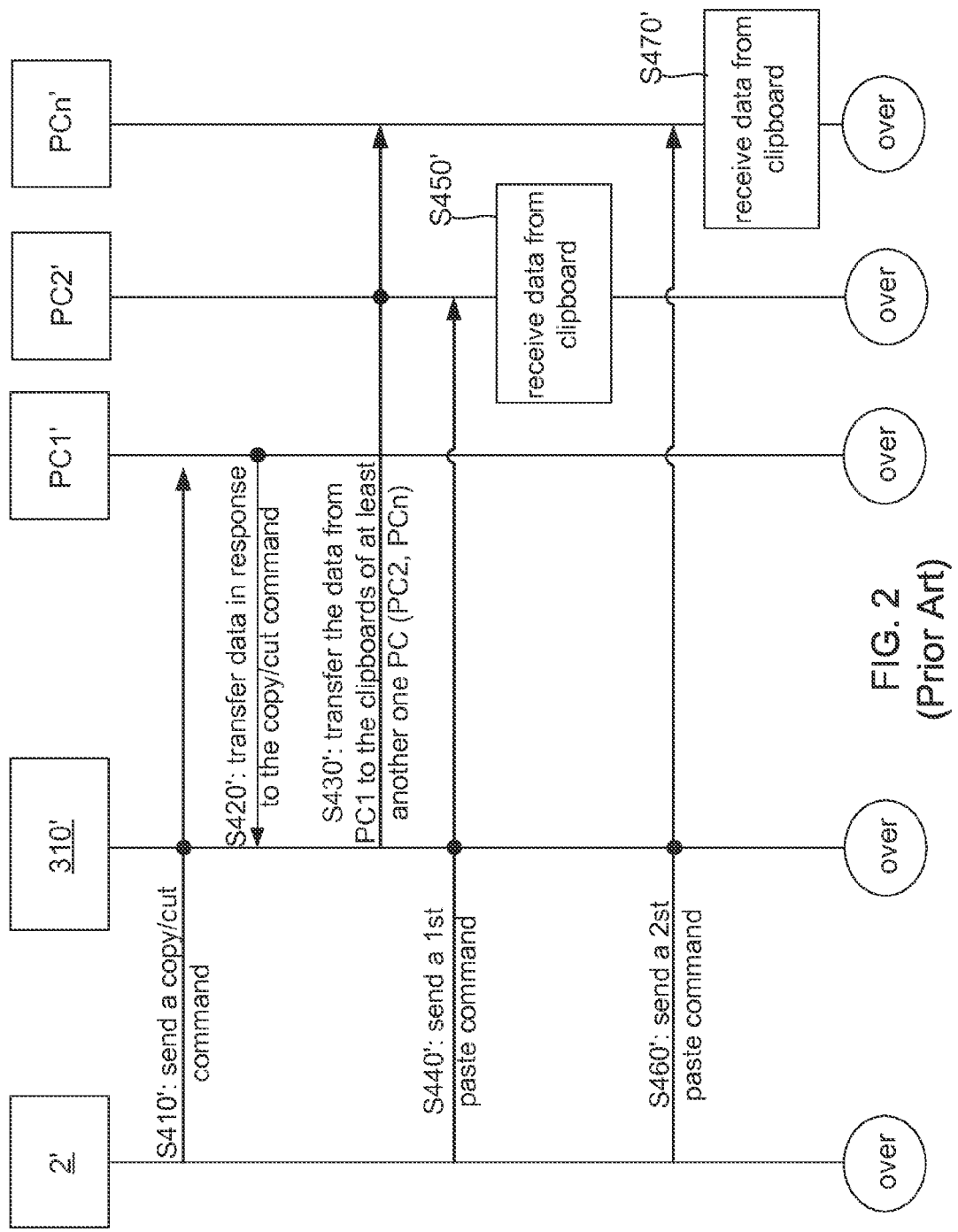
FIG. 2 is a schematic data transmission diagram for a novel data transmission method proposed by an American patent with the patent publication number of US 2009/0319909.
Figure 3:
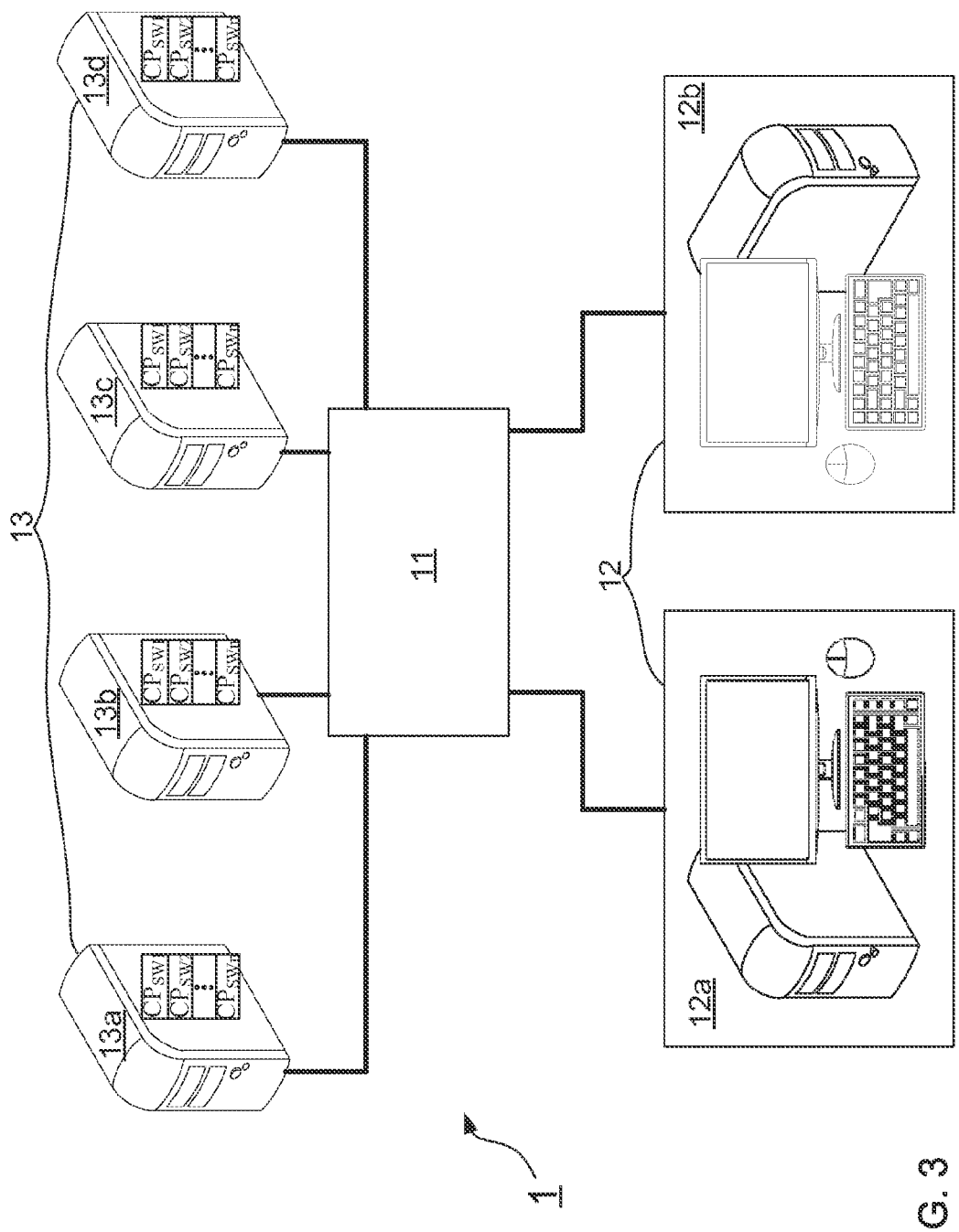
FIG. 3 is a schematic framework diagram of a data transmission system according to the present invention.

With reference to FIG. 3, which illustrates a schematic framework diagram of a data transmission system according to the present invention. As shown in FIG. 3, the data transmission system 1 consisting of: a data transmission device 11, at least one host computer 12 (FIG. 3 shows a first host computer 12a and a second host computer 12b), and at least one associated computer 13 (FIG. 3 shows a first associated computer 13a, a second associated computer 13b, a third associated computer 13c, and a fourth associated computer 13d). All the at least one host computer 12 and the at least one associated computer 13 have their own computer clipboards, wherein the computer clipboard is established by an operation system installed in the host computer 12 (or the associated computer 13), such as Windows 7®. Moreover, all the at least one host computer 12 and the at least one associated computer 13 are installed with a switching application, and the switching application sets a plurality of switching system clipboards ($CP_{sw1}, \ldots, CP_{swn}$) in each of the at least one host computer 12 and the at least one associated computer 13.

Herein, it needs to further explain that the above-mentioned data transmission device 11 is a KM (Keyboard/Mouse) switching device or a KVM (Keyboard/Video/Mouse) switching device. Moreover, the data transmission device can also be a connection device for multi computers simply. In addition, the host computer means the computer connected with a displayer, a keyboard and a mouse and capable of being directly operated by a user. Moreover, through the displayer, the keyboard and the mouse connected to the first host computer 12a, a first user can not only operate the first host computer 12a, but also operate the second host computer 12b and the at least one associated computers 13.

Figure 4:
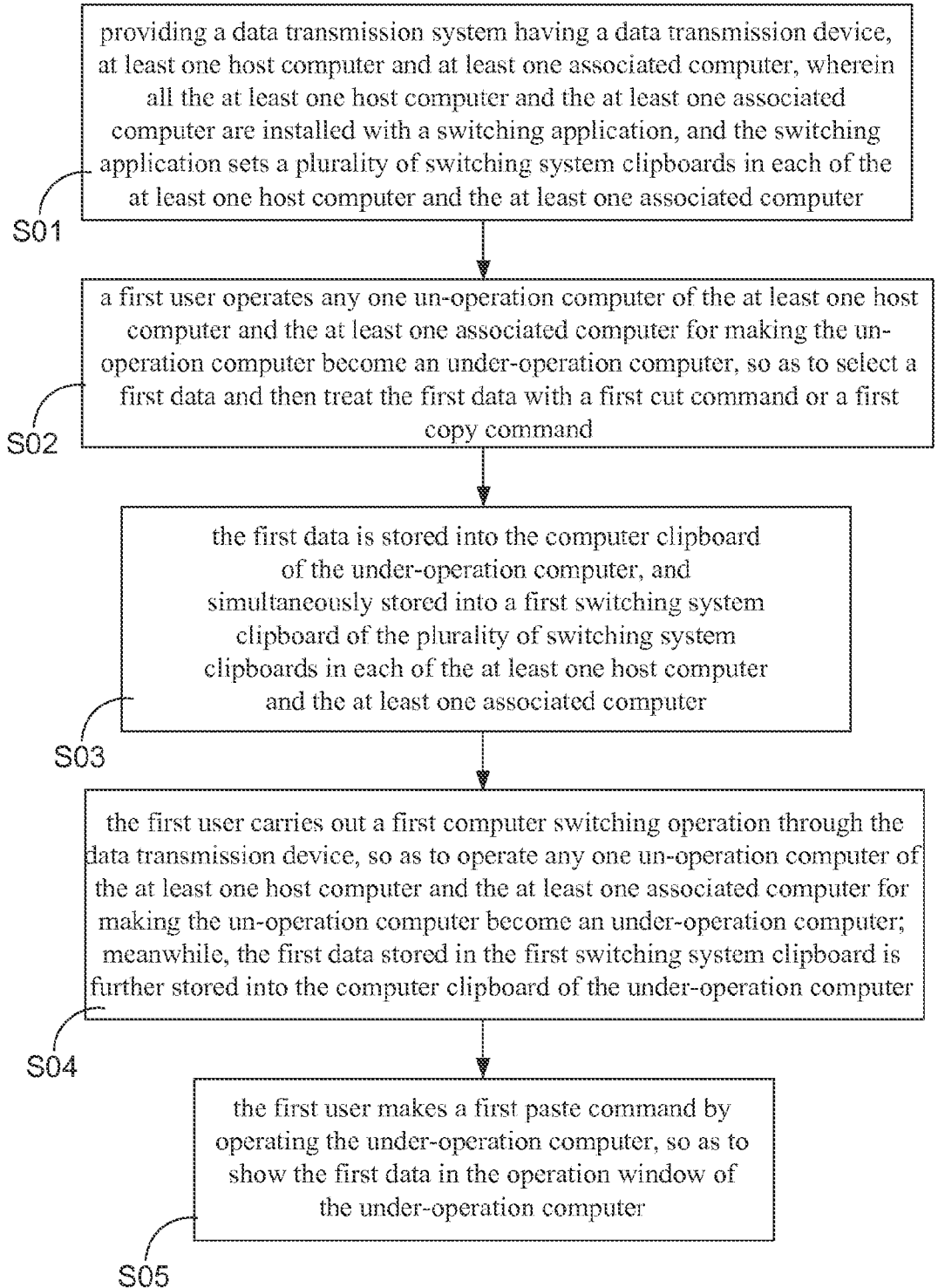
FIG. 4 is a flow chart of a data transmission method for data transmission system according to the present invention.
Figure 5A:
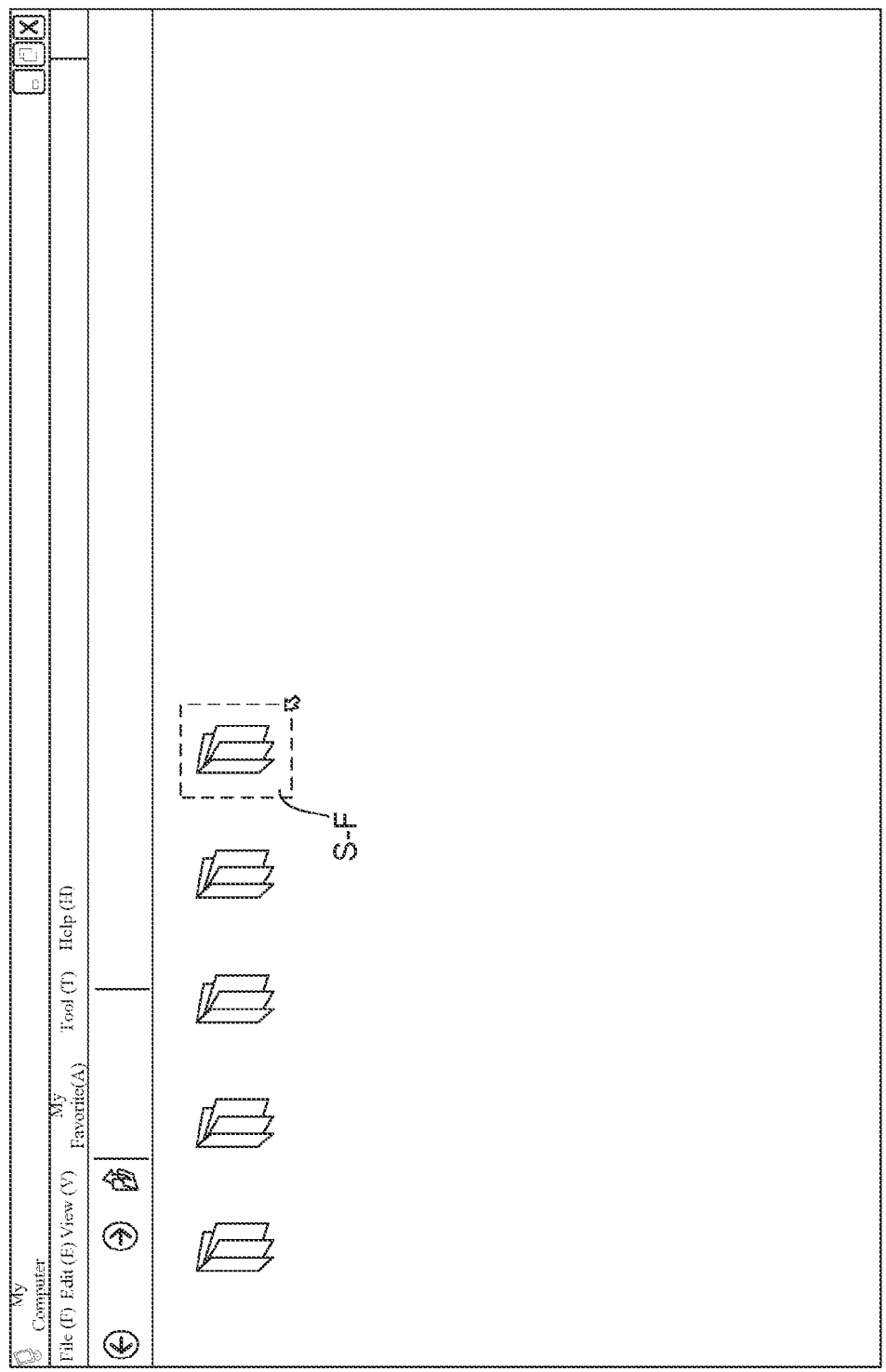
Figure 5C:
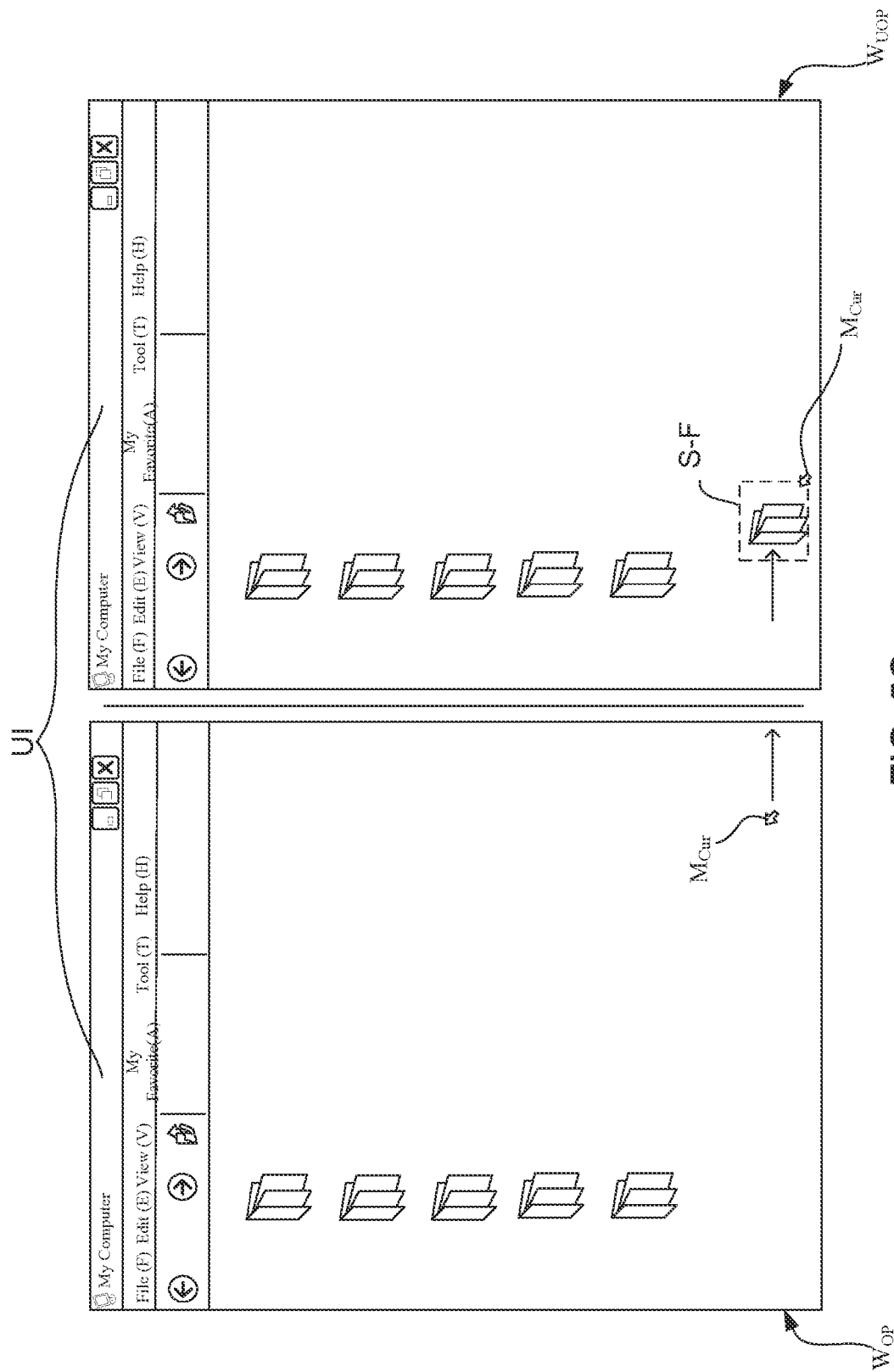

Continuously referring to FIG. 4, which shows a flow chart of a data transmission method for data transmission system according to the present invention; moreover, please simultaneously refer to FIGS. 5A, 5B and 5C, there are shown schematic operation diagrams of the data transmission method for data transmission system. As shown in FIG. 4, the data transmission method mainly consists of 5 steps.

First of all, the data transmission method proceeds to step (S01) for providing a data transmission system 1 having a data transmission device 11, at least one host computer 12 and at least one associated computer 13 (the data transmission system 1 is shown in FIG. 3), wherein each of the at least one host computer 12 and the at least one associated computer 13 are installed with a switching application, and the switching application sets a plurality of switching system clipboards ($CP_{sw1}$, $CP_{sw2}$, . . . , $CP_{swn}$) in each of the at least one host computer 12 and the at least one associated computer 13. Next, step (S02) is executed, such that a first user operates any one un-operation computer of the at least one host computer 12 and the at least one associated computer 13 for making the un-operation computer become a first under-operation computer, so as to select a first data and then treat the first data with a first cut command or a first copy command. As shown in FIG. 3 and FIG. 5, the first user selects a specific data S-F and treats the specific data S-F with a cut command or a copy command by operating the first host computer 12a and using the keyboard and the mouse connected to the first host computer 12a.

Subsequently, the data transmission method proceeds to step (S03) for making the first data be stored into the computer clipboard of the under-operation computer, and be simultaneously stored into a first switching system clipboard $CP_{sw1}$ of the plurality of switching system clipboards ($CP_{sw1}$, $CP_{sw2}$, . . . , $CP_{swn}$) in each of the at least one host computer 12 and the at least one associated computer 13. Herein, it needs to further explain that, the data transmission used for transmitting the specific data to the at least one host computer 12 and the at least one associated computer 13 is unlimited, and can be wire data transmission or wireless data transmission.

Continuously, in step (S04), the first user carries out a first computer switching operation through the data transmission device 11, so as to operate any one un-operation computer of the at least one host computer 12 and the at least one associated computer 13 for making the un-operation computer become the other one first under-operation computer; meanwhile, the first data stored in the first switching system clipboard $CP_{sw1}$ is further stored into the computer clipboard of the first under-operation computer. Eventually, in step (S05), the first user makes a first paste command by operating the first under-operation computer, so as to show the first data in the operation window of the first under-operation computer.

In the present invention, the first computer switching operation is unlimited. For instance, as FIG. 5B shows, the first user is able to carry out the first computer switching operation by way of controlling the mouse connected to the first host computer 12a and making the cursor $M_{cur}$ on a first displayer 12a1 move out of the display boundary of the first displayer 12a1, so as to further move into the display boundary of a second displayer 12b1 of the second host computer 12b. Therefore, the specific data can be shown on the second displayer 12b1 after the first user make the first paste command.

Also, the user can also carry out the computer switching operation through a user interface (UI) provided by the switching application. As shown in FIG. 5C, the user interface (UI) may be a File Manager Window, and the user can complete the computer switching operation by way of moving the cursor $M_{cur}$ from the file manager window of the under-operation computer to the file manager window of the un-operation computer. Although above descriptions introduce two exemplary embodiments for the computer switching operation in the step (S04), that does not used for limiting the scope of the embodiments for the computer switching operation, and all equivalent implementations or alterations within the spirit of the computer switching operation still fall within the scope of the embodiments for the computer switching operation. For example, the user can also finish the computer switching operation through at least one displayer and at least one mouse/keyboard set connected to the data transmission device 11, wherein the data transmission device 11 connected with the at least one displayer and the at least one mouse/keyboard set means the KVM (Keyboard/Video/Mouse) switching device.

Moreover, although FIGS. 5A, 5B and 5C show that the user selects a specific file for completing the data transmission between the multi computers, that does not used for limiting the application scope of the data transmission method of the present invention. In other different applications, the data transmission method also provides the user to select texts, images or combinations of the texts and images for carrying out the data transmission between the multi computers.

Furthermore, the data transmission method of the present invention can also applied for carrying out the data transmission between all-in-one computers, tablet PCs and smart phones. Please refer to a second schematic framework diagram of the data transmission system shown by FIG. 6, the first host computer 12a and the second host computer 12b are the all-in-one touch computers connected to the data transmission device 11, and the at least one associated computer 13 is also connected to the data transmission device 11. In which, all the first host computer 12a, the second host computer 12b, and the at least one associated computer 13 have their own computer clipboard, wherein the computer clipboard is established by an operation system installed in the host computers (12a, 12b) and the associated computers 13, such as Windows 8®, Android® and iOS®. Moreover, all the host computers (12a, 12b) and the associated computers 13 are installed with a switching application, and the switching application sets a plurality of switching system clipboards ($CP_{sw1}$, . . . , $CP_{swn}$) in each of the host computers (12a, 12b) and the computers 13. Therefore, similar to FIGS. 5A, 5B and 5C, the user is able to complete the computer switching operation and the data transmission between multi computers through the data transmission system 1 provided with the data transmission method of the present invention.

Herein, it needs to further explain that, the method flow provided by FIG. 4 is merely for the first user (i.e., s single user); however, because the switching application sets a plurality of switching system clipboards ($CP_{sw1}$, . . . , $CP_{swn}$) in each of the host computers (12a, 12b) and the associated computers 13, the data transmission system 1 installed with the data transmission method of the present invention also provides the other users (i.e., a second user or more users) to simultaneously carry out their computer switching operations and data transmissions between multi computers via the data transmission device 11, and the file size of the transmitted data does not be limited by the data transmission device 11.

Figure 6:
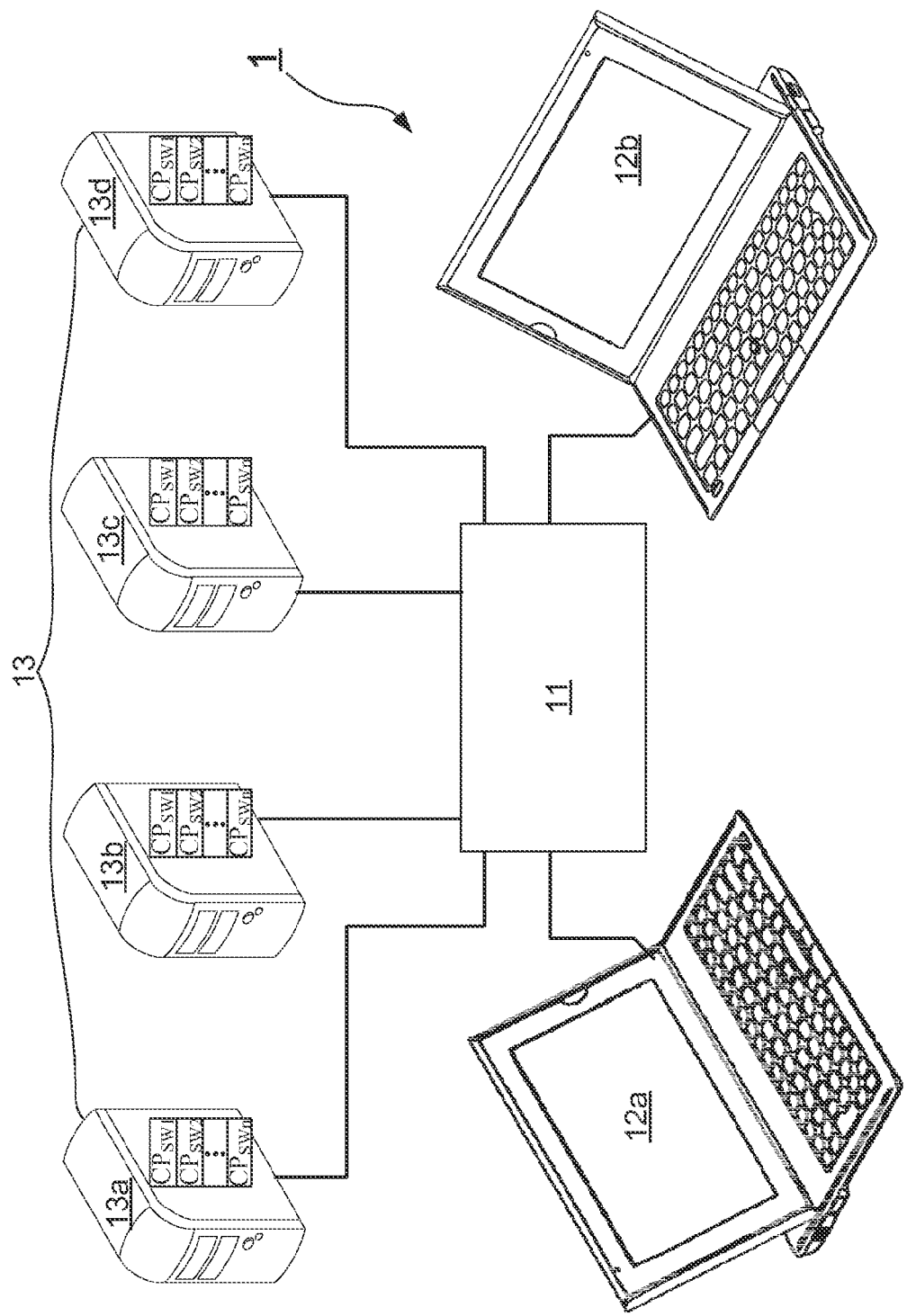
FIG. 6 is a second schematic framework diagram of the data transmission system.
Figure 7:
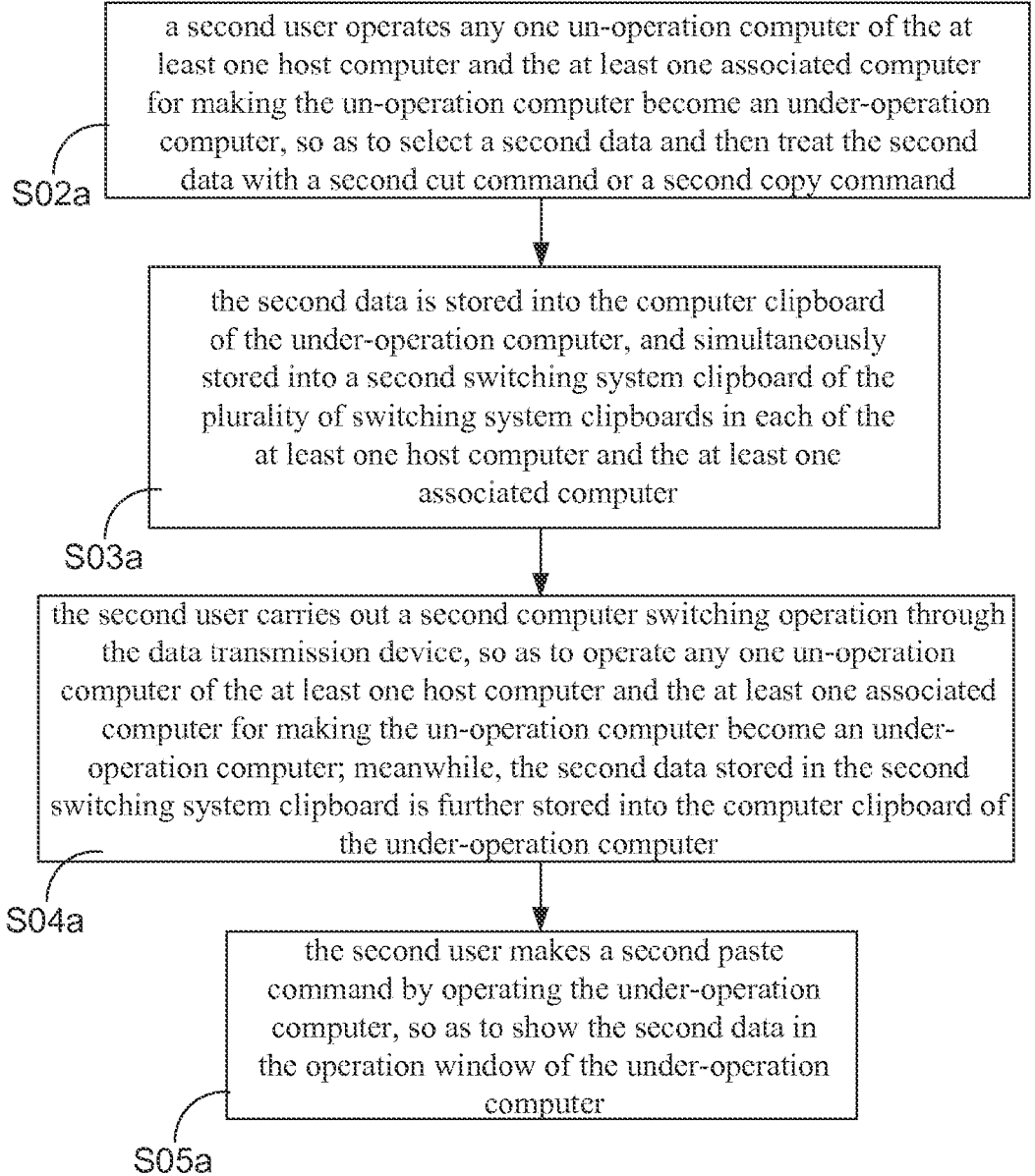
FIG. 7 is a first added flow chart of the data transmission method for data transmission system according to the present invention.

Inheriting to above descriptions, if there are two users (i.e., the first user and the second user) utilize the data transmission system 1 shown as FIG. 3 or FIG. 6 to carry out the their computer switching operations and data transmissions between multi computers at the same time, the data transmission method would not only execute the method flow shown as FIG. 4, but also simultaneously execute the method flow shown by FIG. 7. In which, the method flow shown as FIG. 7 consists of the following steps: step (S02a): a second user operates any one un-operation computer of the at least one host computer 12 and the at least one associated computer 13 for making the un-operation computer become the second under-operation computer, so as to select a second data and then treat the second data with a second cut command or a second copy command; step (S03a): the second data is stored into the computer clipboard of the second under-operation computer, and simultaneously stored into a second switching system clipboard $CP_{sw2}$ of the plurality of switching system clipboards ($CP_{sw1}, \ldots, CP_{swn}$) in each of the at least one host computer 12 and the at least one associated computer 13; step (S04a): the second user carrying out a second computer switching operation through the data transmission device 11, so as to operate any one un-operation computer of the at least one host computer 12 and the at least one associated computer 13 for making the un-operation computer become the other one second under-operation computer; meanwhile, the second data stored in the second switching system clipboard $CP_{sw2}$ is further stored into the computer clipboard of the second under-operation computer; and step (S05a): the second user makes a second paste command by operating the second under-operation computer, so as to show the second data in the operation window of the second under-operation computer.

Figure 8:
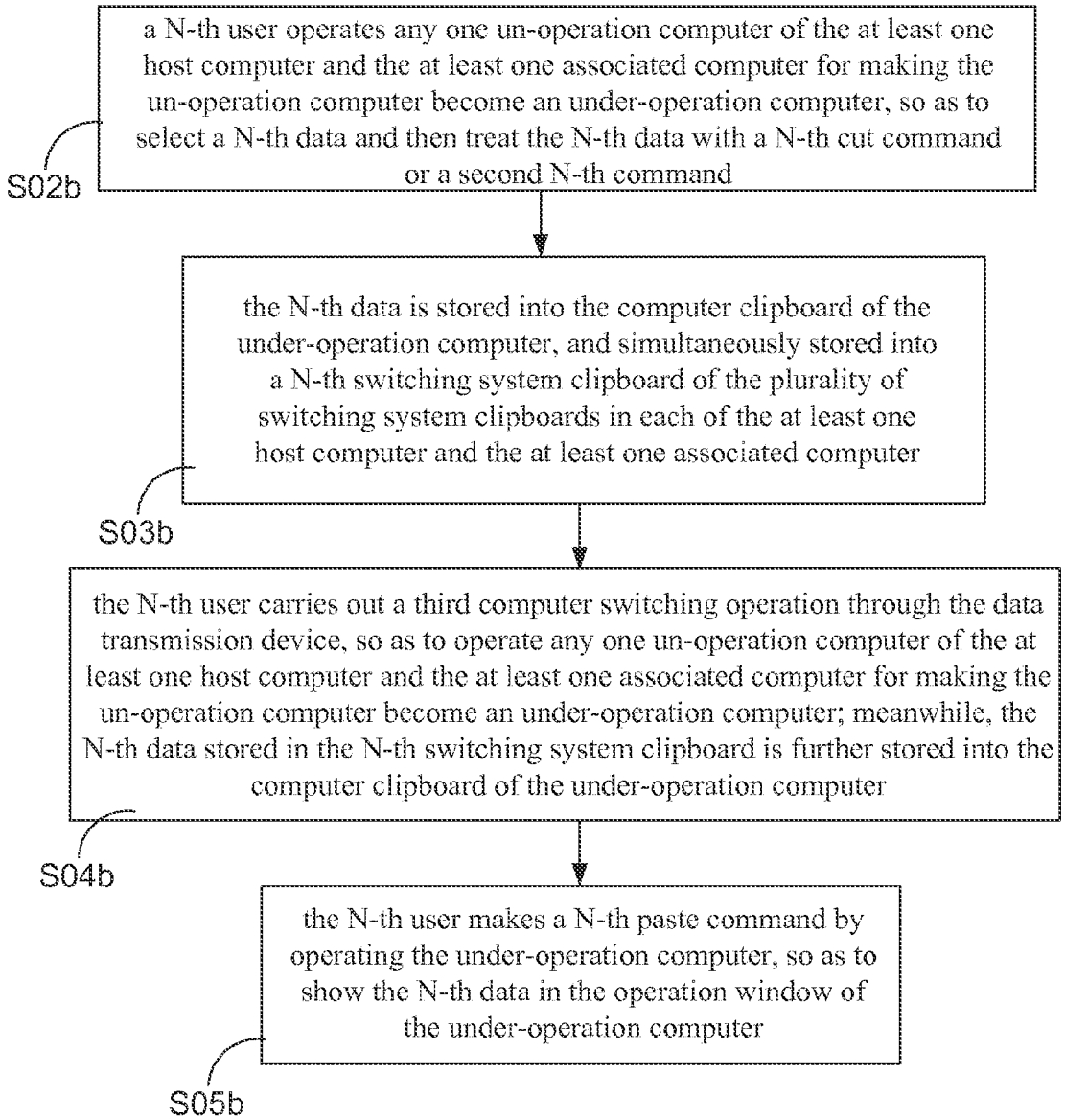
FIG. 8 is a second added flow chart of the data transmission method for data transmission system according to the present invention.

Furthermore, if there are N users (i.e., the first user, the second user and a N-th user) utilize the data transmission system 1 shown as FIG. 3 or FIG. 6 to carry out the their computer switching operations and data transmissions between multi computers at the same time, the data transmission method would not only execute the method flows shown as FIG. 4 and FIG. 7, but also simultaneously execute the method flow shown by FIG. 8. In which, the method flow shown as FIG. 8 consists of the following steps: step (S02b): a N-th user operates any one un-operation computer of the at least one host computer 12 and the at least one associated computer 13 for making the un-operation computer become a third under-operation computer, so as to select a N-th data and then treat the N-th data with a N-th cut command or a second N-th command; step (S03b): the N-th data is stored into the computer clipboard of third the under-operation computer, and simultaneously stored into a N-th switching system clipboard $CP_{swn}$ of the plurality of switching system clipboards ($CP_{sw1}, \ldots, CP_{swn}$) in each of the at least one host computer 12 and the at least one associated computer 13; step (S04b): the N-th user carries out a third computer switching operation through the data transmission device 11, so as to operate any one un-operation computer of the at least one host computer 12 and the at least one associated computer 13 for making the un-operation computer become the other one third under-operation computer; meanwhile, the N-th data stored in the N-th switching system clipboard $CP_{swn}$ is further stored into the computer clipboard of the third under-operation computer; and step (S05b): the N-th user making a N-th paste command by operating the third under-operation computer, so as to show the N-th data in the operation window of the third under-operation computer.

Figure 9:
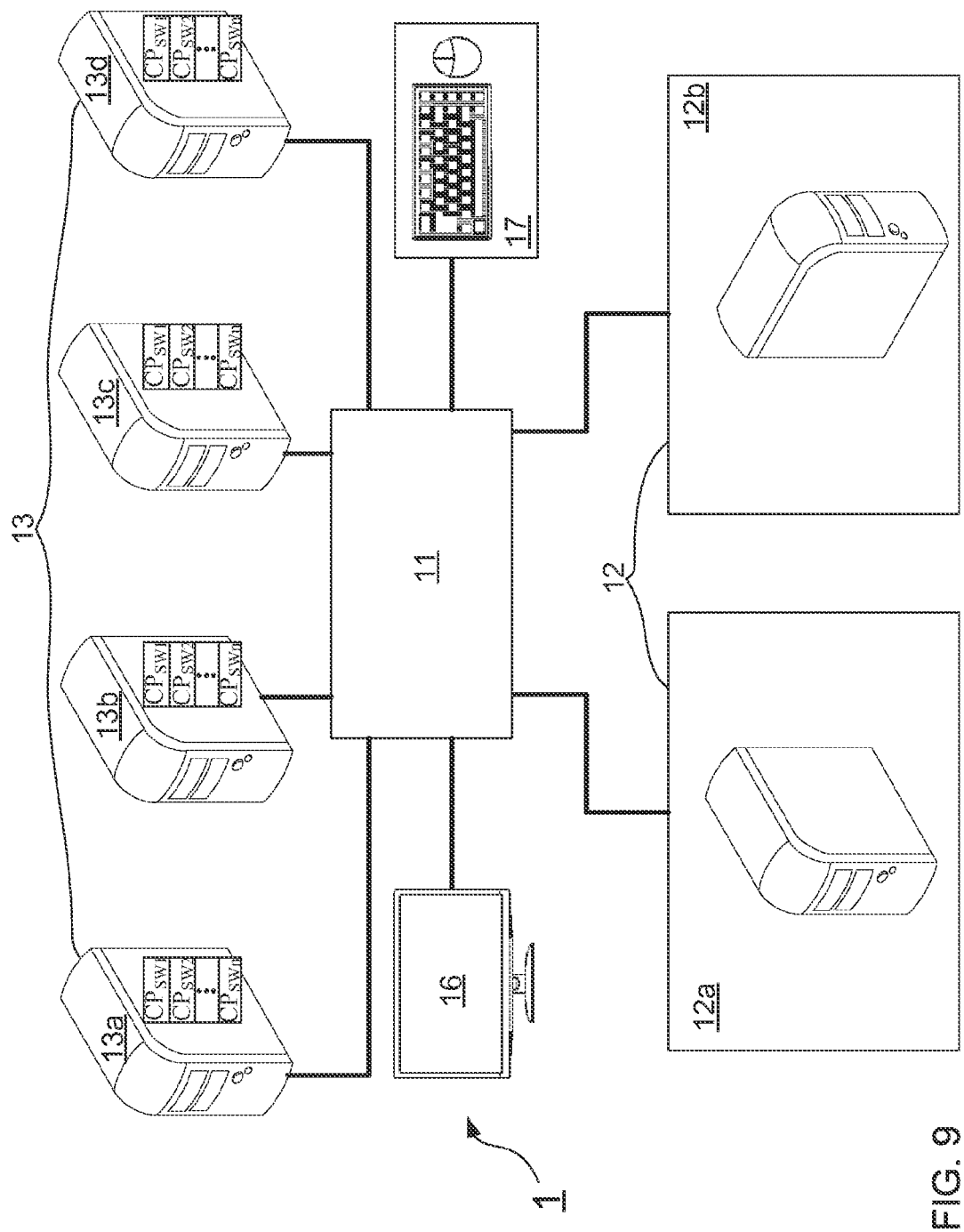
FIG. 9 is a schematic application diagram of the data transmission method.

Moreover, in others applications, the data transmission method of the present invention can also be applied to the data transmission system 1 shown by FIG. 9, wherein the data transmission system 1 consists of: at least one host computer (12a, 12b), at least one associated computer (13a, 13b, 13c, 13d) and a data transmission device 11. In addition, the data transmission device 11 is connected with at least one displayer 16 and at least one keyboard/mouse set 17. Therefore, the user can also finish the computer switching operation through the at least one displayer 16 and the at least one mouse/keyboard set 17 connected to the data transmission device 11.

Thus, above descriptions have completely and clearly introduce the method steps and technology features of the data transmission method for data transmission system proposed by the present invention; in summary, the data transmission method includes the primary advantage of: by the disposing of the plurality of switching system clipboards ($CP_{sw1}, CP_{sw1}, \ldots, CP_{swn}$), two or more users are allowed to simultaneously carry out their computer switching operations and data transmissions between multi computers through one identical data transmission system, moreover, the file size of the transmitted data does not be limited by the data transmission device of the data transmission system.

The above description is made on embodiments of the present invention. However, the embodiments are not intended to limit scope of the present invention, and all equivalent implementations or alterations within the spirit of the present invention still fall within the scope of the present invention.

What is claimed is:

1. A data transmission method for data transmission system, comprising the steps of:
   (1) providing a data transmission system having a data transmission device, at least one host computer and at least one associated computer, wherein each of the at least one host computer and the at least one associated computer are installed with a switching application, and the switching application setting a plurality of switching system clipboards in each of the at least one host computer and the at least one associated computer;
   (2) a first user operating any one un-operation computer of the at least one host computer and the at least one associated computer for making the un-operation computer become one first under-operation computer, so as to select a first data and then treat the first data with a first cut command or a first copy command;
   (3) the first data being stored into the computer clipboard of the first under-operation computer, and simultaneously stored into a first switching system clipboard of the plurality of switching system clipboards in each of the at least one host computer and the at least one associated computer;
   (4) the first user carrying out a first computer switching operation through the data transmission device, so as to operate any one un-operation computer of the at least one host computer and the at least one associated computer for making the un-operation computer become the other one second under-operation computer; meanwhile, the first data stored in the first switching system clipboard being further stored into the computer clipboard of the second under-operation computer; and (5) the first user making a first paste command by operating the first under-operation computer, so as to show the first data in the operation window of the first under-operation computer.

2. The data transmission method for data transmission system of claim 1, wherein the data transmission device is selected from the group consisting of: KM (Keyboard/Mouse) switching device, KVM (Keyboard/Video/Mouse) switching device and connection device for multi computers.

3. The data transmission method for data transmission system of claim 2, wherein the data transmission device is connected with at least one displayer and at least one mouse/keyboard set.

4. The data transmission method for data transmission system of claim 1, wherein the first user carries out the first computer switching operation through a user interface provided by the switching application in the step (4).

5. The data transmission method for data transmission system of claim 1, wherein the first user carries out the first computer switching operation through at least one displayer and at least one mouse/keyboard set connected to the data transmission device in the step (4).

6. The data transmission method for data transmission system of claim 1, further comprising the steps of:
   (2a) a second user operating any one un-operation computer of the at least one host computer and the at least one associated computer for making the un-operation computer become a second under-operation computer, so as to select a second data and then treat the second data with a second cut command or a second copy command;
   (3a) the second data being stored into the computer clipboard of the second under-operation computer, and simultaneously stored into a second switching system clipboard of the plurality of switching system clipboards in each of the at least one host computer and the at least one associated computer;
   (4a) the second user carrying out a second computer switching operation through the data transmission device, so as to operate any one un-operation computer of the at least one host computer and the at least one associated computer for making the un-operation computer become the other one second under-operation computer; meanwhile, the second data stored in the second switching system clipboard being further stored into the computer clipboard of the second under-operation computer; and
   (5a) the second user making a second paste command by operating the second under-operation computer, so as to show the second data in the operation window of the second under-operation computer.

7. The data transmission method for data transmission system of claim 6, wherein the second user carries out the second computer switching operation through a user interface provided by the switching application in the step (4a).

8. The data transmission method for data transmission system of claim 6, wherein the second user carries out the second computer switching operation through at least one displayer and at least one mouse/keyboard set connected to the data transmission device in the step (4a).

9. The data transmission method for data transmission system of claim 6, further comprising the steps of: (2b) a N-th user operating any one un-operation computer of the at least one host computer and the at least one associated computer for making the un-operation computer become a third under-operation computer, so as to select a N-th data and then treat the N-th data with a N-th cut command or a second N-th command; (3b) the N-th data being stored into the computer clipboard of third the under-operation computer, and simultaneously stored into a N-th switching system clipboard of the plurality of switching system clipboards in each of the at least one host computer and the at least one associated computer; (4b) the N-th user carrying out a third computer switching operation through the data transmission device, so as to operate any one un-operation computer of the at least one host computer and the at least one associated computer for making the un-operation computer become the other one third under-operation computer; meanwhile, the N-th data stored in the N-th switching system clipboard being further stored into the computer clipboard of the third under-operation computer; and (5b) the N-th user making a N-th paste command by operating the third under-operation computer, so as to show the N-th data in the operation window of the third under-operation computer.

10. The data transmission method for data transmission system of claim 9, wherein the N-th user carries out the third computer switching operation through a user interface provided by the switching application in the step (4b).

11. The data transmission method for data transmission system of claim 9, wherein the N-th user carries out the third computer switching operation through at least one displayer and at least one mouse/keyboard set connected to the data transmission device in the step (4b).

* * * * *